United States Patent [19]
Wald et al.

[11] 4,415,401
[45] Nov. 15, 1983

[54] CONTROL OF ATMOSPHERE SURROUNDING CRYSTAL GROWTH ZONE

[75] Inventors: Fritz Wald, Wayland; Juris P. Kalejs, Wellesley, both of Mass.

[73] Assignee: Mobil Solar Energy Corporation, Waltham, Mass.

[21] Appl. No.: 216,300

[22] Filed: Dec. 15, 1980

Related U.S. Application Data

[63] Continuation-in-part of Ser. No. 129,075, Mar. 10, 1980, abandoned.

[51] Int. Cl.³ .............................................. C30B 15/34
[52] U.S. Cl. ............................ 156/608; 156/DIG. 89
[58] Field of Search ....... 156/608, DIG. 88, DIG. 89; 148/1.5; 422/246

[56] References Cited

U.S. PATENT DOCUMENTS

| | | | |
|---|---|---|---|
| 4,040,895 | 8/1977 | Patrick | 156/618 |
| 4,118,197 | 10/1978 | Mackintosh et al. | 156/608 |
| 4,193,974 | 3/1980 | Kotval et al. | 156/608 |

FOREIGN PATENT DOCUMENTS 2638303 3/1978 Fed. Rep. of Germany ... 156/DIG. 89

OTHER PUBLICATIONS

Materials Research Bulletin-Labelle et al., Pergamon Press, New York, 1971.
Baker, Oxygen and Carbon Content of Czochroslski Silicon Crystals in Semiconductor Silices 1969–Electrochemical Society, New York.
Akiyama et al., Appl. Physics Lett., vol. 22, No. 2, pp. 630–631, 6/15/73.

*Primary Examiner*—Hiram H. Bernstein
*Attorney, Agent, or Firm*—Schiller & Pandiscio

[57] ABSTRACT

The invention pertains to growth of silicon bodies from a melt and comprises enveloping the liquid/solid interface with a mixture of an inert gas and more than a trace amount of a carbon-containing gas. The carbon-containing gas may be a compound of carbon and oxygen such as CO or $CO_2$, and oxygen gas also may be introduced to the growth zone.

24 Claims, 5 Drawing Figures

CONTROL OF ATMOSPHERE SURROUNDING CRYSTAL GROWTH ZONE

The Government has rights on this invention under Contract No. NAS7-100, JPL Subcontract 954355.

This is a continuation-in-part of our copending U.S. Patent application Ser. No. 129075, filed Mar. 10, 1980 for Control of Atmosphere Surrounding Crystal Growth Zone now abandoned.

This invention relates to the growth of crystals from a melt and more particularly to improvements in processes of growint elongated crystalline bodies from a melt of silicon.

BACKGROUND OF THE INVENTION

Various processes are now known for growing crystalline bodies. One process which has been devised for growing crystalline bodies with diverse cross-sectional shapes with excellent dimensional control over long lengths is the so-called EFG technique which is exemplified and described in varying detail in U.S. Pat. Nos. 3,591,348, 3,687,633 and 3,953,174. In the EFG method, a wettable capillary die conducts the melt from a reservoir supply (usually contained in a crucible) to the growing crystal interface just above the top of the die, with the shape of the resulting crystalline body being determined by the shape of the growth meniscus which in turn is controlled by the perimeter of the die top. Another process for growing crystalline bodies with controlled cross-sectional shapes is disclosed by U.S. Pat. No. 4,000,030, issued Dec. 28, 1976 to T. F. Ciszek. In the latter patent the method described involves use of a submerged projection extending above the level of the melt with the crystal growth occurring from a melt meniscus formed over the upper end of the projection.

The foregoing methods have been applied to or considered for growing silicon for use in fabricating photovoltaic solar cells. The growth of silicon for use in making solar cells is complicated by the fact that the presence of crystallographic defects and certain impurities in the silicon have an adverse effect on solar cell efficiency. The presence of carbon and oxygen impurities in EFG silicon has been noted.

As in the Czochralski or dendritic web melt-growth systems for silicon, carbon and oxygen levels in EFG grown silicon ribbon can be expected to be influenced both by the type of crucible used and the composition of the ambient gases in contact with the melt. However, important distinctions must be made for the EFG process which limit the parallel that may be drawn in comparing the processes by which carbon and oxygen reach steady-state concentrations in the crystalline product. This situation arises in part from the isolation of the crucible (bulk) melt from the melt ahead of the growth interface (bounded by the meniscus at the EFG die top) dictated by the geometric configuration of the die, and in part because of the relatively high EFG growth speeds. The separation of the bulk and the meniscus allows temperature differences as large as 50 degrees C. to 100 degrees C. to be maintained between them under typical growth conditions, with the result that the mechanism controlling the occurrence of oxygen and silicon in EFG-grown crystals is not exactly the same as in the Czochralski process. The effect of carbon and oxygen impurities is not known with certainty but both negative and positive influences of these on ribbon quality have been suggested.

It has been recognized that the presence of precipitated carbon in silicon causes the leakage current to be higher without any notable change in forward characteristics (see N. Akiyama et al., Lowering of Breakdown Voltage of Semiconductor Silicon Due to the Precipitation of Impurity Carbon, Appl. Physics Lett., Vol. 22, No. 12, pp. 630–631, June 15, 1973). There has been disagreement as to whether or not the presence of oxygen in semiconductor silicon is harmful, particularly if impurity carbon also is present. It has been suggested that oxygen should be eliminated or reduced to a negligible level in order to maximize carrier lifetime. On the other hand, U.S. Pat. No. 4,040,895 suggests that a reduction in leakage currents occurs at higher oxygen levels, e.g. $13 \times 10^{17}$ to $17 \times 10^{17}$ atoms/cc.

Other impurities which tend to occur as solutes in silicon bodies produced by the EFG and Ciszek and methods, and which have been found to have an adverse effect on the electronic properties of silicon, are: iron, titanium, copper, zirconium, molybdenum, aluminum, manganese and copper. Silicon carbide also occurs as an inclusion in the product. These additional impurities, like carbon and oxygen, may be derived from the dies, crucibles, associated heat control members such as heaters, heat shields and insulators, and other furnace components and the ambient environment in the furnace. These additional impurities tend to be distributed throughout a silicon ribbon so as to reduce carrier lifetime generally through the ribbon and thus limit the conversion efficiency of solar cells made therefrom and also the total yield of high efficiency solar cells. As a consequence, the preferred practice in growing silicon ribbon by EFG has been to (a) make the dies, crucibles and furnace components out of mateials with as high a purity as possible and (b) carry out the growth process in an inert gaseous environment using a gas of as high purity as possible.

The coice of die and crucible material is complicated by the fact that molten silicon reacts with and/or dissolves most substances that may be likely candidates as die or crucible materials. Since a degree of reactivity between molten silicon and the die is unavoidable, it is desirable that the reaction product be electrically neutral in the silicon crystal or, if insoluble in silicon, be structurally compatible in order not to generate an excessive density of crystallographic defects which would lead to excessive polycrystallinity. Additionally the die must be arranged and made of a material such that a crystallization front of suitable configuration may be maintained at all times, thereby to reduce the occurrence of discoloration defects in the crystals (in this connection it is to be noted that in the usual case a silicon ribbon grown by EFG is not an ideal single crystal but instead is generally rather imperfect in nature). In the growth of silicon, fused quartz, silicon nitride, silicon carbide and graphite have been considered most seriously as possible die materials. Fused quartz has been rejected since it has barely wetted by liquid silicon; silicon nitride is unacceptable since it tends to react too rapidly with molten silicon; silicon carbide is wetted by silicon and has adequate strength at the melting point of silicon, but the difficulty of machining silicon carbide per se makes it unacceptable in the case of capillary dies for growing relatively thin ribbons, such as ribbon with a thickness of 0.006 to 0.0020 inch. Also silicon carbide in forms suitable for making capillary dies is not available in adequate purity.

Because of the limitations of the foregoing die materials, current EFG technology is based upon graphite dies since graphite has adequate strength at the melting point of silicon, is easily machineable, is available commercially in forms suitable for making capillary dies in greater purity than silicon carbide, and is wetted adequately and in a stable manner by silicon (in current EFG technology, it is preferred that the crucibles also be made of graphite). However, the use of graphite dies is limited by the tendency for silicon carbide crystals to form at the die top as a consequence of the reaction of graphite and silicon (frequently to the point of stopping ribbon growth or providing variations in the shape of the ribbon or causing crystallization defects in the form of grain boundaries, voids or dislocations). These particles disturb the crystallization front and also tend to be picked up as occlusions by the growing crystal. With regard to silicon carbide occlusions, it is well established that silicon ribbons grown by EFG using graphite dies can have silicon carbide particles at levels which are harmful to solar cell performance and that a reduction in the occurrence of silicon carbide particles in the ribbon tends to result in an improvement in the yield of 10-12% efficiency solar cells obtainable from such ribbons.

The typical inert gas used in order to reduce the occurrence of impurities in the grown crystal is argon, although other insert gases also have been used or suggested. In any event, the usual procedure is to use inert gases which are substantially free of other gases, i.e., contain less than 5 ppm of any other gas with the exception of oxygen and water, the latter each being present in quantities as high as 10-25 ppm. The inert gas is usually caused to flow through the furnace at a controlled rate calculated not to disturb the crystallization front while assuring that any volatile impurities in the region of the growth zone will be swept out of the furnace so as to reduce the likelihood of the same being picked up by the growing crystalline body.

Notwithstanding the careful control of the composition of the die, crucible and other furnace components and the purity and rate of flow of the inert gas in the region of the growth interface, unpredicted variations in silicon ribbon quality have continued to be observed. Some of the variations appear to be due to the occurrence of large silicon carbide particles on the ribbon surface or in the ribbon at its surface, and/or the presence of high levels of carbon in the ribbon. Also in practical EFG ribbon growth systems it is difficult to control the oxygen content in the furnace in a reproducible manner and at low concentrations. Therefore, the concentration and effect of oxygen in the ribbon tends to vary unpredictably.

Accordingly, the primary object of this invention is to provide a method of growing crystalline silicon bodies using a wettable capillary die or equivalent so as to substantially reduce the formation of large silicon carbide particles at the liquid/solid interface, reduce the occurrence of silicon carbide in the grown crystalline body, and improve the electronic quality of the product. A more specific object of the invention is to provide a method of growing crystals of silicon and the like using the EFG or Ciszek methods so as to substantially improve the solar energy conversion efficiency of solar cells made from such crystals.

The foregoing and other objects hereinafter described or rendered obvious are achieved by deliberately modifying the ambient atmosphere in the crystal growing furnace, particularly at or in the region of the growth interface. More specifically, it has been discovered that silicon ribbon suitable for the manufacture of relatively high efficiency solar cells can be produced on a more consistent basis using a graphite capillary die and a graphite crucible if the ambient atmosphere is made to include suitable amounts of one or more carbon-containing gases, so as to modify the growth conditions to such an extent that significant improvements in ribbon properties result. Specifically and preferably the ambient atmosphere comprises a gas or gases containing both carbon and oxygen such as carbon monoxide (CO) or carbon dioxide ($CO_2$). Alternatively the ambient atmosphere may be made to include a hydrocarbon such as methane ($CH_4$).

Other features and many of the attendant advantages of this invention are described or rendered obvious by the following detailed specification which is to be considered together with the accompanying drawing wherein.

In the growth of crystals by the EFG process hereinabove described, the usual growth conditions have comprised an ambient atmosphere consisting of high purity argon which is passed through the furnace at relatively high flow rates (15-25 volume changes per hour). In furnaces where the EFG die forms part of a crystal-growing cartridge which also includes an electrically-powered afterheater as disclosed in U.S. Pat. Nos. 4,118,197 and 4,158,038, the usual practice is to pass argon through two or more orifices in the cartridge exiting at or near the growth zone. The preferred embodiment of the invention is described hereinafter in connection with a crystal-growing cartridge which is a modification of the one shown in U.S. Pat. No. 4,118,197, but it is to be understood that the invention is applicable to the EFG process where no cartridge is employed and also to the Ciszek crystal growing process hereinabove described.

Essentially the present invention involves the introduction into the ambient atmosphere surrounding a silicon growth zone, in an EFG or Ciszek process, of a selected carbon-containing gas, so as to achieve a favorable growth condition conductive to the formation of crystalline silicon bodies which are characterized by an improvement in at least some of the qualities which affect their use in the production of silicon solar cells. More particularly, in processes of the type described, the invention consists in introducing one or more selected carbon-containing gases, preferably a gas or gases containing both carbon and oxygen, into a crystal-growing furnace, so as to achieve in the vicinity of the liquid/solid growth interface a carbon-containing gas concentration level such as to reduce the incidence of crystallographic defects and occlusions of silicon carbide. The oxygen may be molecularly bound to the carbon of the carbon-containing gas which is introduced to the furnace, e.g., as the oxygen content of CO gas, and alternatively or additionally it may be introduced as oxygen gas.

Referring now to the drawing the illustrated apparatus is a furnace in the form of an enclosure 2 having sight ports 4 for viewing crystal growth. Mounted within the furnace by means of a suitable support 6 is a graphite crucible 8. Also mounted within the furnace enclosure is a plurality of electrical resistance graphite heaters 10. Although not shown, it is to be understood that these heaters are connected to a suitable electrical power supply located externally of the furnace. Heaters 10 are spaced and disposed so as to supply heat to crucible 8 to convert the silicon feed material which it contains to a melt 12. The upper end of the crucible is closed off by a graphite cover member 14 which is attached to and forms the floor of a unitary cartridge 16 adapted for the invention. As described hereinafter in greater detail, the cartridge contains a capillary die 40, means for establishing a linear cooling zone above the liquid/solid interface, and means for feeding a gas around the growing crystal body close to the liquid/solid interface.

The upper end of furnace enclosure 2 is formed with an access port 18 through which cartridge 16 may be introduced into the furnace enclosure and disposed as shown in the drawing. Additionally the lower end of enclosure 2 has an inlet port fitted with a conduit 17 which is connected to a source of a suitable gas, e.g. an inert gas such as argon, or an inert gas containing a selected carbon-containing gas and/or oxygen as a gas or as a molecular constituent of the carbon-containing gas, in accordance with this invention.

The upper end of cartridge 16 preferably comprises a metal header plate 20 which serves as a heat sink and also determines by engagement with the upper end wall of the furnace the extent to which the cartridge may be lowered into the furnace.

Cartridge 16 comprises an outer housing 24 of rectangular cross-section which is made of a heat resistant material and is attached to and depends from header 20. Cover member 14 is attached to and supported by the four walls of housing 24. Disposed within the same housing and attached to and depending from header 20 are two heat conductive graphite plates 26A and 26B. These plates form the heat conductive medium of an afterheater designed to function as a temperature profile controller in accordance with the teachings of U.S. Pat. No. 4,158,038. In this preferred mode of practicing the invention, plates 26A and 26B are rectangular in cross-section (FIG. 5) and are tapered lengthwise so as to assist in providing a controlled substantially linear temperture gradient along their lengths. The mutually confronting faces of plates 26A and 26B are formed with recesses which coact to define a narrow rectangular passageway 28 for the ribbon 29 which is to be grown.

Figure 1:
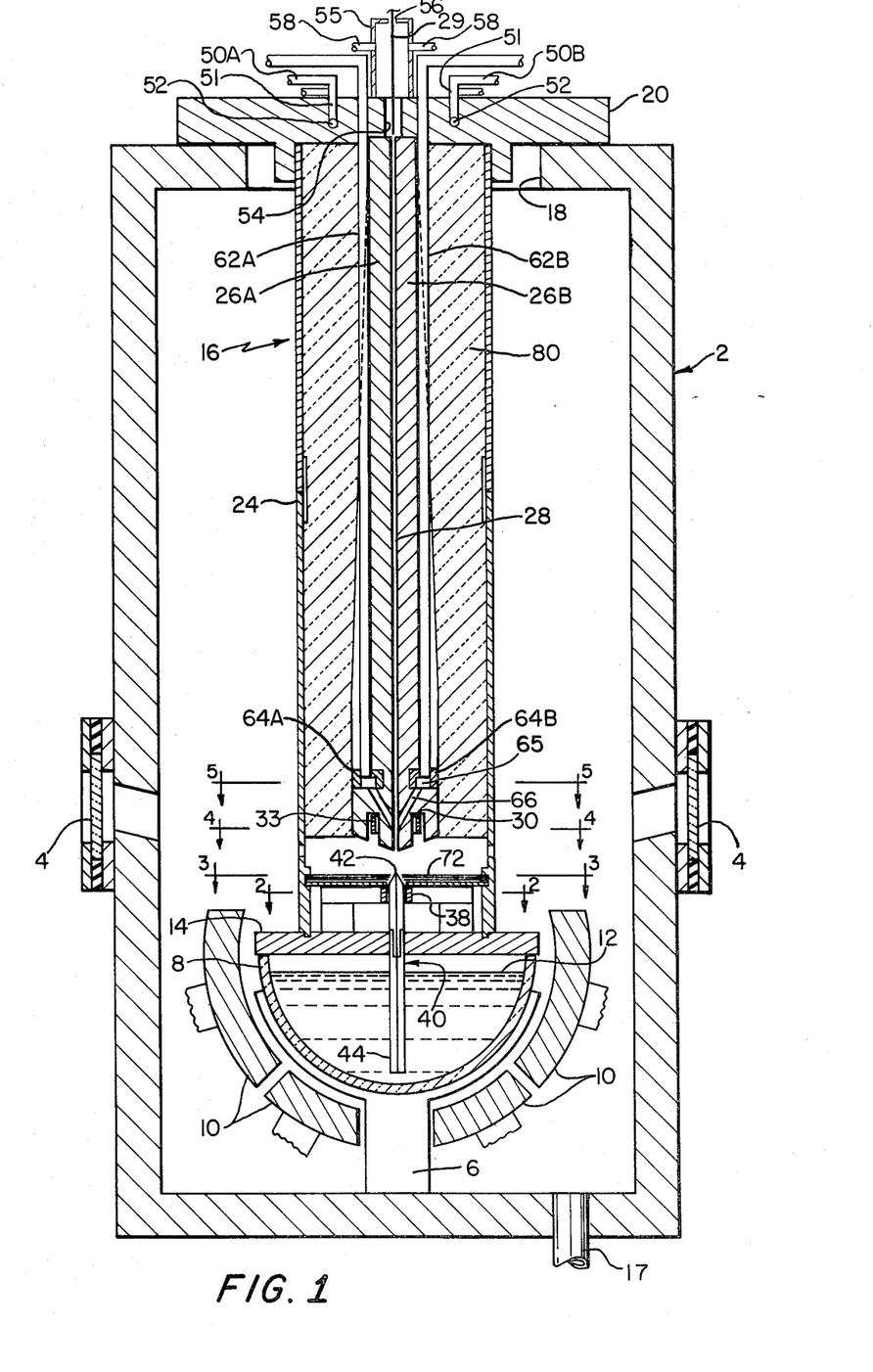
FIG. 1 is a longitudinal sectional view of apparatus utilized in growing silicon ribbon according to a preferred mode of practicing the present invention.
Figure 4:
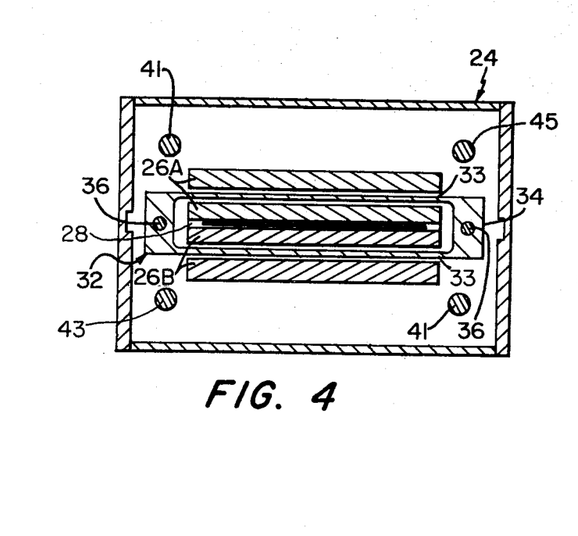

Referring now to FIGS. 1 and 4, the lower ends of plates 26A and 26B are notched to form two like recesses 30 to accommodate an electrical resistance afterheater 32 made of graphite. Afterheater 32 may take various shapes and in the illustrated case it is shaped so that in plan view it is in the form of a bar having a rectangular aperture, with two side sections 33 (FIG. 4) extending along recesses 30 and the two end sections 34 extending alongside of the opposite edge surfaces of plates 26A and 26B. Heater 32 is affixed to and supported by a pair of electrical current feed bars 36.

Figure 2:
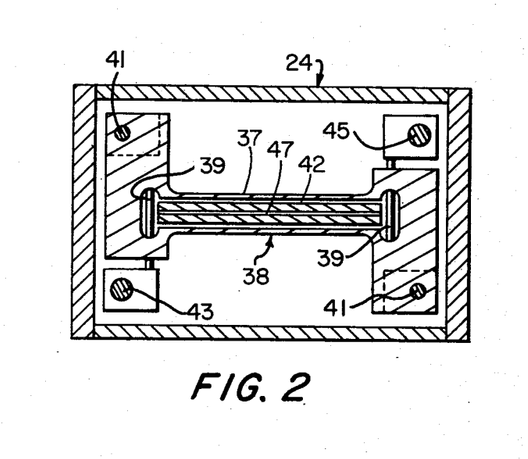
FIGS. 2, 3, 4 and 5 are cross-sectional views of the same apparatus taken along lines 2—2, 3—3, 4—4 and 5—5 respectively in FIG. 1.
Figure 3:
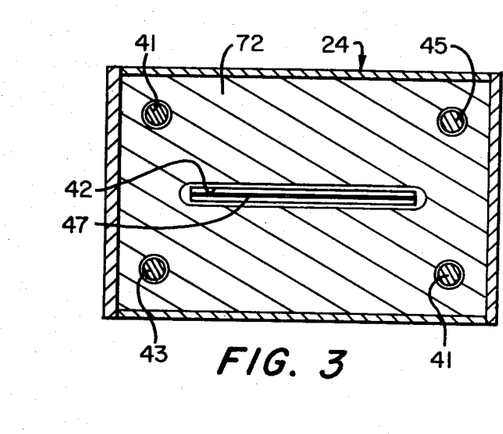

The cartridge also includes an electrical resistance die heater 38 (FIG. 2) and a pair of electrical resistance die end heaters 39. Heater 38 has face heating sections 37 that extend along the broad sides of the upper end section 42 of the capillary die 40. Heaters 38 and 39 are made of graphite. Heater 38 is affixed to and supported by first and second electrical current feed bars 41 which are anchored in header 20. One end heater 39 is supported and energized by one of the feed bars 41 and a third feed bar 43, while the other end heater is supported and energized by the other feed bar 41 and a fourth feed bar 45. In accordance with the teachings of U.S. Pat. No. 4,118,197, the electrical feed bars extend lengthwise parallel to plates 26A and 26B and are anchored in header 20. Header 20 is provided with suitable means (not shown) for connecting the various current feed bars to a source of electric power. Heater 32 heats the lower ends of plates 26A and 26B and heaters 38 and 39 heat the four sides of the upper end of capillary die 40.

The die 40 may be constructed in various ways. In this particular embodiment it is made of graphite and comprises upper and lower sections 42 and 44. Upper section 42 has a narrow horizontal capilary slot 47 which extends for substantially the full breadth of its upper end and communicates with one or more capillaries in the lower section 44. The latter section comprises two plates between which the lower end of upper section 42 is secured. The lower section 44 in turn is secured in cover member 14 and is sized so that its capillaries extend into melt 12.

Header 20 is formed with a slot 54 through which the growing ribbon is withdrawn. Slot 54 is elongated in a direction perpendicular to the plane of FIG. 1 and is aligned with passageway 28. Two cooling pipes 50A and 50B are attached to cooling header 20 on opposite sides of slot 54. Pipes 50A and 50B are U-shaped, comprising two parallel vertical sections 51 (only one of which is visible in FIG. 1) connected at their bottom ends by a horizontal section 52 (FIG. 1) disposed within header 20. Cooling pipes 50A and 50B are connected to a source of cooling water (not shown) by suitable means (also not shown) comprising external piping and a pump. Based upon the foregoing description, it is seen that parallel cooling fluid circuits are provided whereby cooling water is circulated through the header via pipes 50A and 50B so as to remove heat from the upper end of plates 26A and 26B.

Figure 5:
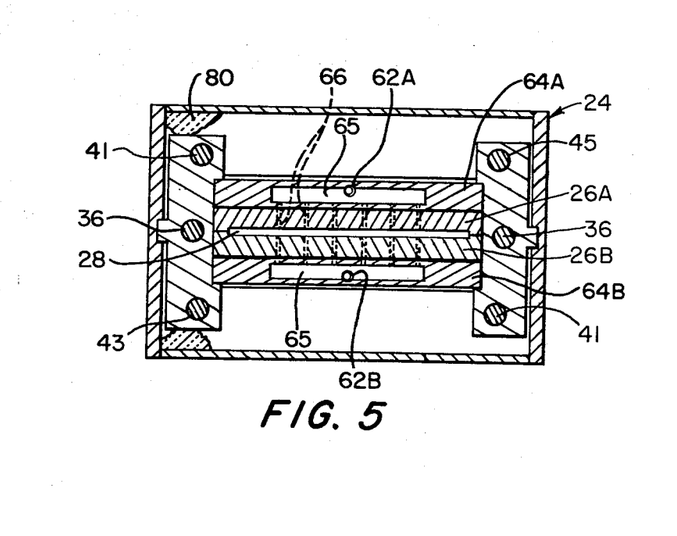

The cartridge also includes gas feeding means in the form of a pair of relatively small diameter quartz or graphite pips 62A and 62B which are secured to header 20 and extend along slots in plates 26A and B, with their upper ends being connected to a source of gas (not shown) exterior of the furnace. The lower ends of pipes 62A and 62B are secured in holes formed in two gas feed insert plates 64A and 64B which are attached to plates 26A and B. Each plate 64A and B is made of a heat resistant material and is arranged to provide a manifold chamber 65 so as to provide communication between the associated gas feed pipe 62 (A or B) and one or more small inclined openings 66 in each of the plates 26A and B. As seen in FIG. 5, openings 66 in each plate 26A or B are aligned in a direction perpendicular to the plane of FIG. 1 parallel to the slot 28, so that gas introduced via pipes 62A and B will pass into the elongate space 28 between plates 26A and 26B around the growing ribbon 29 (for convenience of illustration the portion of ribbon 29 extending between die 40 and header 20 is omitted from FIG. 1). Preferably the gas is introduced to the upper ends of pipes 62A and B under a selected positive pressure and at a rate high enough to maintain a gas environment between plates 26A and B as hereinafter described. The gas usually is introduced at room temperature and thus tends to cause some cooling of the growing ribbon.

The cartridge preferably includes one or more flat plates 72 as a heat shield for the die 40. Plates 72 have elongate center slots through which extends the upper end of die 40. A suitale heat insulating material 80, e.g. graphite felt, is packed into the housing around plates 26A and B as shown to reduce heat loss.

To the extent already described the apparatus of FIGS. 1-5 is old and well known. According to the usual mode of operation prior to this invention, argon gas of highest available purity is passed continuously into the furnace enclosure via conduit 17 at relatively high rates (calculated to provide between about 15-25 volume changes of gas per hour). By way of example, in a particular furnace used in the development of this invention, the argon is fed to conduit 17 at a high rate, e.g. 10-20 liters/minute, while at the same time argon gas is passed into slot 28 via pipes 62A and B at a rate between about 0.1 and about 4.0 liters per minute. A ribbon 29 is continuously grown from the upper end of die 40 and the melt consumed in formation of the ribbon is replaced by upward flow of melt in the capillary passageway(s) of the die. The temperature profile controller comprising heat conductive plates 26A and 26B and insulation 80 provides a linear cooling zone characterized by the inner surfaces of plates 26A and 26B extending parallel and closely adjacent to the opposite broad sides of ribbon 29. Heat is removed from the upper end of the heat conducting plates 26A and B by header 20 while heat is supplied to the lower end of the same plates by heater 32, whereby a temperature gradient is established lengthwise in the heat conducting plates with the lower ends of those plates being at a substantially higher temperature than their upper ends. The ribbon 29 is pulled at a controlled speed, usually in the range of about 1.5 to 2.5 cm/min., by means of a suitable pulling mechanism (not shown). The pulling speed is set according to the rate at which the latent heat of fusion is removed from the ribbon at the crystillization front, i.e., the interface between the growing ribbon and the melt film at the upper end of die 40.

In conventional EFG operation the temperature profile controller is arranged so that (1) plates 26A and B are at a temperature at their lower ends close to but below the melting point of silicon and at a temperature at their upper ends close to but preferably below the temperature at which significant plastic flow will occur in silicon, (2) 26A and 26B will induce a substantially constant temperature gradient along the length of the ribbon as the ribbon moves along passageway 28, and (3) the ribbon will be at a temperature below that at which no significant plastic flow will occur therein as or immediately after it passes beyond the upper ends of plates 26A and B. This mode of operation aids in causing the ribbon to have little or no residual stresses after it has cooled to room temperature. Since the melting point of silicon is about 1415 degrees C. and little significant plastic flow will occur in a silicon body after it has been cooled to below a temperature of between about 600 degrees C. and about 800 degrees C., the preferred practice is to operate the temperature profile controller so that the vertical temperature gradient along plates 26A and B is constant at some value between about 25 and $\phi$C. degrees/cm, with the temperature at their lower ends between about 1050 and 1250 degrees C. and the temperature at their upper end at about 600 degrees C. or less.

It is known that certain gases tend to exist or be produced in the furnace, e.g., by outgassing of furnace components. Since many native furnace ambient gases are detrimental to crystal growth and product quality, they must be removed from the furnace. In an open furnace as shown in FIG. 1 (so-called to distinguish it from a furnace where the enclosure is kept under a vacuum and hence must be completely air-tight), there is also the problem of leakage of air into enclosure 2 via slot 28, and also around the cartridge. The enclosure 2 usually is not provided with a gas outlet port and instead the only intended exit path for the argon purge gas is via cartridge slot 28. Therefore, it has been customary to (a) provide to seal between the cartridge header and the enclosure to prevent or limit leakage of air via access hole 18 and (b) set the argon gas pressure and flow rates at levels sufficient to purge the enclosure of natural ambient gases and also to prevent backstreaming of air in slot 28.

As indicated above the present invention involves modifying the ambient conditions by deliberately introducing a carbon-containing gas, preferably a gas which also contains oxygen, into the gaseous environment in the region of the liquid/solid interface, which interface also is sometimes referred to as the "growth zone". Two major benefits are derived from the invention. First, the as-grown ribbon quality, as measured by the SPV diffusion length (minority carrier diffusion length as determined by the surface photo voltage technique), increases significantly over that for ribbon growth under standard conditions, i.e. the same EFG operation conditions except for no carbon-containing gas. The second major benefit is a reduction in the frequency of SiC particle pickup on the ribbon surface.

The present invention resulted from experiments to determine whether the growth process is affected by the rate of flow of argon purging gas in the furnace enclosure and cartridge. A number of experimental runs were made where the dilution of native furnace ambient gases was reduced by decreasing the mainstream purge gas flow rate, i.e., the flow in conduit 17, to about 2.5 liters/min. while having no flow in pipes 62A and B. In order to prevent backstreaming at the decreased mainstream purge gas flow rate, a plenum chamber 55 having a slot 56 aligned with slot 54 was mounted on top of header 20. Chamber 55 surrounded slot 54 and was provided with one or more pipes 58 through which argon gas from a suitable source (not shown) external of the furnace, was introduced into it at a selected flow rate, typically about 2-6 liters/minute, sufficient to prevent backstreaming of air. In effect the argon supplied to chamber 55 acted as a gas barrier.

Examination of the as-grown quality of the ribbon from those experimental runs revealed that they were characterized by average SPV diffusion lengths of 40 to 50 $\mu$m, whereas the corresponding values for ribbons grown under standard conditions are typically in the 15 to 35 $\mu$m range. It was observed that the growth of those ribbons sharing improved characteristics was accompanied by decreases in SiC particle growth on the die top and the occurrence of a film on the ribbon surface. It is believed that those changes were attributable to processes associated with increased levels of CO within the furnace. That hypothesis is based on the premise that CO may be expected to be the dominant contaminating native furnace ambient gas inside the furnace under operating conditions, due to the large surface area of hot graphite parts available to undergo rapid oxidation in the presence of other gases (such as $CO_2$, $H_2O$ and $O_2$) to form CO. Hence the CO concentration increases at decreased purge gas mainstream flow rates as a result of both a reduced level of dilution of resident furnace gases resulting from outgassing and an increase in backstreaming of species such as $CO_2$, $H_2O$ and $O_2$ from outside of the furnace. Consequently if the CO in increased concentration were to change the balance of carbon (and oxygen, if any) in the melt, processes responsible for the formation of SiC particles at the die top also should be affected. Of interest in this respect is the fact that the film found on the ribbons grown in the experimental runs has been identified as consisting primarily of SiC and $SiO_x$ (where x has a value of between 1 and 2), with the former exhibiting many of the characteristics of expitaxially grown SiC. However, the improved results obtained in the experimental runs where the ribbons were characterized by a film thereon, were found difficult to reproduce in subsequent runs due to inability to reproduce a given ambient state (as judged by the intensity of visible film on the ribbon product) by varying the purge gas main zone flow rate. Observations suggested that adjustment of the main zone flow rate as a means of controlling ambient conditions could not be relied upon to yield improved results due to the fact that the CO levels in the furnace are affected by other variables such as the degree of outgassing and backstreaming and the availability of oxygen and $H_2O$ in the furnace due to leaks or varying concentrations of the same in the argon gas.

The essence of this invention, to deliberately introduce a carbon-containing gas into the growth system, is accomplished most conveniently by admixing the carbon-containing gas with the argon or whatever other inert gas is fed into the furnace. Where a cartridge similar to that shown in FIG. 1 is employed, the carbon-containing gas and the inert gas may be premixed and fed into the furnace via pipes 62A and 62B and also conduit 17. Alternatively and preferably, the carbon-containing gas may be omitted from the gas introduced via conduit 17. In the case where no crystal growth cartrige is used, e.g., as in a furnace arrangement such as shown by U.S. Pat. No. 3,591,348, the carbon-containing gas may be admixed with whatever gas is passed through the furnace enclosure or introduced by gas jet devices located at the growth zone. The important guideline is to introduce a carbon-containing gas to the crystal growth zone so as to achieve results as herein described.

It has been concluded that the silicon carbide which forms on the die top is the result of reaction of silicon in the melt with carbon coming from the die and also from the crucible via the melt in that crucible. It also has been concluded that the film occurring on the silicon ribbon when carbon-bearing gases are introduced is due to growth of SiC and $SiO_x$ on the ribbon surface above the growth interface. More specifically it has been found that the density of relatively large SiC particles on both sides of the ribbon decreases dramatically for the same ambient conditions that result in increases of the density of the film on the ribbon.

Somewhat different results have been achieved with introduction of CO, $CO_2$ and $CH_4$ gases. It should be noted that at the melting point of silicon both carbon dioxide and methane are unstable and tend to decompose, with carbon monoxide and oxygen resulting from $CO_2$ decomposition and carbon and hydrogen resulting from $CH_4$ decomposition. When $CO_2$ is used, the film that is formed on the ribbon is a combination of $SiO_x$ and $SiC_x$ (predominantly $SiO_x$), where x has a value of between 1 and 2, has a color which ranges from white to gray when thin and gets darker with increasing thickness, the electrical properties of the ribbon are mostely uniformly improved, and the film is easy to remove by etching. CO produces a film on the ribbon which also is a combination of $SiO_2$ and SiC (but predominantly SiC), has a color characteristic like the film formed when $CO_2$ is used, and is easily etched off. However, the electrical properties of the ribbon are not as uniformly improved as when $CO_2$ is used. $CH_4$ is a reducing agent. It produces a film which is blueish when thin and gets blacker with increasing thickness. More importantly, the film consists substantially of only SiC and as a result the film is difficult to remove by etching. Nevertheless, using $CH_4$ in accordance with this invention does improve the electrical properties of the ribbon. Presently $CO_2$ is preferred.

Mixtures of these and/or other carbon-containing gases or carbon- and oxygen-containing gases mentioned hereinafter also may be used in practicing this invention. While the carbon-containing gas could be introduced separately from the inert gas, it is preferred that it be introduced as a pre-mixture with the inert gas in order to facilitae control over its concentration level in the furnace.

It has been determined that in a furnace arrangement as shown in FIGS. 1-5, the preferred mode of practicing the invention comprises: (a) maintaining an inert gas environment in the furnace enclosure by feeding an inert gas to it via conduit 17; (b) maintaining the main zone gas flow rate via conduit 17 at a moderate level, e.g., 2-6 liters/min., so as to assure removal of native furnace gases from the growth interface; (c) maintaining a gas flow of 2-6 liters/min. in plenum chamber 55; (d) supplying pipes 62A and B with a mixture of an inert gas and a carbon-containing gas in selected proportions; and (e) feeding gas to openings 66 at a flow rate and pressure selected so that, despite the upward flow of argon introduced via conduit 17, the carbon-containing gas will reach the growth zone in a concentration suitable for the purposes of this invention. Openings 66 are located as close to the top end of the die 40 as the geometry of the cartridge permits, so as to facilitate having an adequate concentration of carbon-containing gas in the growth zone. Omitting the carbon-containing gas from the argon gas introduced via conduit 17 facilitates controlling the concentration of carbon-containing gas in the growth zone.

It has been determined that when CO is fed to the furnace, its concentration in the atmosphere about the growth interface should be maintained between about 25 and 5000 ppm, and it appears that the concentration of $CO_2$, $CH_4$ or other carbon containing gas (or the total concentration of all such gases where a mixture is used) should be kept within the same limits. The optimum and maximum tolerable concentration of carbon-containing gas in the atmosphere surrounding the growth zone may vary according to the geometry of the system, the flow rate and pattern of flow of gases in the furnace enclosure, and the species of carbon-containing gas used. Thus, for example, the maximum concentration which will give the desired benefit may be as low as 2000 ppm under certain flow conditions. Concentrations of CO and $CO_2$ higher than about 5000 ppm tend to cause difficulties due to rapid formation of scum (SiC or $SiO_x$) at the die top which adversely affects the meniscus connecting the growing ribbon with the melt film at the die top and thus provides an obstacle to ribbon growth. Too high a concentration of $CH_4$ tends to result in formation of carbon "soot" deposits. These carbon deposits are effective in disrupting die top thermal balance. In general a concentration of between about 50 and 2000 ppm carbon-containing gas appears to be preferable in the atmosphere surrounding the growth zone.

If the concentration of carbon-containing gas is too high, e.g. above 5000 ppm, disruption of film growth on the ribbon will occur. The disruption is believed to result from one or more of the following: (1) a change in growth conditions occurs due to the thermal transfer capability in the film; and (2) the carbon-containing gas reacts with the silicon melt at the die top and causes a change in the shape of the ribbon due to a change in the shape of the die top. Also if the concentration of carbon-containing gas is excessive, a difficulty in seeding may occur due to an increase in scum formation at the upper end of the die. If the concentration of carbon-containing gas is less than about 25 ppm, the beneficial results of this invention are not attained.

Best overall results are achieved when the film formed on the surface of the ribbon is dull and has a thickness of between about 200 and 600 Å. A thicker film tends to occur at carbon-containing gas concentrations in the growth zone of from about 2000 to 5000 ppm or higher, and in such case discrete SiC particle growth at the die-top is greatly reduced but die top deposits tend to be picked up by the ribbon surface. These deposits on the ribbon surface contribute to decreasing growth stability and to reducing SPV diffusion lengths.

It is to be understood that the optimum flow rates for the gas introduced to the system via conduit 17 or the like and via pipes 62A and B or the like, like the optimum concentration of carbon-containing gas in the ambient, will vary according to the particular furnace and/or cartridge configuration and/or dimensions. The important consideration is to control the composition and rate of gas flow around the growth zone so as to maintain the carbon-containing gas concentration (and hence the amount of CO) in that zone at a level which will provide an optimum balance of relatively low die top deposits and a film on the ribbon product which is dull and has a thickness of between about 200 and 600 Å, since that balance has been found to yield as-grown ribbon quality having SPV average diffusion lengths between 40 and 50 $\mu$m. Improved diffusion lengths have been achieved at various purge gas mainstream flow rates, although best results appear to be achieved at mainstream flow rates producing at least five to fifteen gas volume changes per hour in the furnace enclosure. Lower flow rates tend to result in thicker films attended by growth difficulties, while much higher flow rates, e.g., more than 25 volume changes per hour tend to reduce the film thickness to below 200 Å and/or lead to SPV diffusion length degradation to the lower levels characteristic of the standard operating conditions noted above.

By way of example, in the apparatus heretofore used in practicing the invention, carbon-containing gas concentrations of between about 50 and 2000 ppm in the region of the growth zone may be achieved by (a) feeding pure argon gas to conduit 17, (b) feeding a mixture of argon gas and a carbon-containing gas to the pipes 62A and B, (c) maintaining the relative amount of carbon-containing gas in the argon gas feed to pipes 62A and B to between about 0.05 and 1.0 vol. %; (d) feeding gas to conduit 17 at a rate in the order of about 5 liters/min. (calculated to provide about 10 vol. changes per hour), and (e) feeding gas to pipes 62A and B at a rate in the range of about 0.1 to about 4.0 liters/min. and at a pressure slightly greater than the pressure maintained in the furnace enclosure by gas delivered by conduit 17, whereby the gas exiting openings 66 will intrude into the atmosphere immediately surrounding the die top, the lower end of the growing crystalline body, and the liquid meniscus extending between the die and the growing body.

Table I below presents the results from a number of runs carried out in the manner described below with apparatus similar to that shown in the drawings. Each case in the table represents a compilation of two or more runs. In each run the operating conditions were the same except for the gas composition and flow rates. In each run the argon gas that was used was of highest available purity, containing less than between about 5 ppm of any other material except for up to about 10–25 ppm each of water vapor and oxygen. The concentrations of carbon-containing gas are stated on a volume basis. Case #1 represents the "standard" operating conditions, Case #2 represents the same conditions modified only to the extent of reducing the mainstream gas flow corrresponding to the flow of gas introduced via conduit 17; Cases #3, 4 and 5 are representative of conditions employed when a selected carbon-containing gas is incorporated in the gas fed to the cartridge via means corresponding to pipes 62A and B. Case #3 constitutes a preferred mode of practicing the invention. The SPV diffusion length values are for the as-grown ribbon. The solar cell efficiencies are for cells made from the same ribbons. The SPV values of Cases #4 and 5 indicate that the grown material has the potential to be made into high efficiency solar cells.

In each run the die was dimensioned so that at its upper end its outer edge configuration defined a rectangle measuring about 0.01 inch by 3 inches. The two graphite plates 26A and B were about 8 inches long and 3 inches wide, and had a thickness varying from about 0.45 inch at the bottom end to about 0.20 inch at the upper end. With the crucible 8 filled with a melt of P-type silicon (doped with boron so as to have about 1 ohm-cm resistivity), the cartridge 16 was disposed as shown in FIG. 1 so that the lower end of die 40 was submerged in the melt. The molten feed material rose to the top of the die. Heat was supplied to the system by energizing the heaters previously described so that (1) the temperature of the die in the region of heater 38 was about 10–30 degrees C. above the melting point of silicon and (2) the temperature of plates 26A and B in the region of heater 32 was about 1200 degrees C. Cooling water was circulated through pipes 50A and 50B so as to keep header plate 20 at a temperature below 50 degrees C. The temperature of the upper ends of plates 26A and 26B was about 400 degrees C. Argon gas was fed into the furnace and cartridge via conduit 17 and pipes 62A and B at a selected rate (see Table I below). Thereafter, a seed crystal was lowered by means of a suitable pulling mechanism (not shown) through passageway 28 and hole 58 so as to make contact with the top of the die. The lower end of the seed crystal melted and connected with the molten material at the upper end of the die. Thereafter, the crystal pulling mechanism was operated so as to cause the seed crystal to be pulled upwardly at a selected rate in the range of 0.6 to 1.0 inch/minute. As the seed crystal was pulled upwardly, a flat silicon ribbon 22 measuring about 0.01 inch thick by about 2.0 inch wide was continuously formed on the seed. The resulting ribbon was cooled to room temperature after it passed out of the furnace enclosure by radiation, conduction and convection. The ribbons from these runs were studied to determine their SPV diffusion lengths and also made into photovoltaic solar cells using well known diffusion and metalization techniques. In the course of making the solar cells the $SiC/SiO_x$ films were removed from the ribbons as a preliminary step by etching using a bath of a suitable etchant, e.g., $HF/NH_4F$. These solar cells had junctions located about 0.5 microns below one surface, plus a grid-like electrode deposited on that one surface and a solid electrode deposited on and covering substantially all of the opposite surface, in a manner generally similar to what is shown in U.S. Pat. No. 3,361,594. An antireflective coating was formed on each solar cell over the surface having the grid electrode. Solar cell efficiencies were measured under AM1(100 $mW/cm^2$) conditions.

It also is to be appreciated that the concentration of CO gas in the growth zone may be increased by introducing oxygen gas to the furnace in addition to the introduction of carbon-containing gas or gases as above described, since the oxygen will react readily with the hot graphite parts of the apparatus to form CO or $CO_2$. The oxygen gas preferably is supplied in admixture with the carbon-containing gas, e.g., in admixture with one or more of the following gases: Co, $CO_2$ and $CH_4$. Alternatively the oxygen gas may be supplied separately or in admixture only with the inert gas. The oxygen may be supplied to the furnace enclosure, e.g., via conduit 17 or a similarly located feed pipe, but preferably it is supplied to the cartridge as is preferred for the carbon-containing gas. Addition of oxygen will reduce the amount of carbon-containing gas required to be supplied to the apparatus in order to achieve the desired CO concentration in the growth zone. The desired CO concentration in the growth zone when oxygen gas as

TABLE I

| Case No. | Gas Composition (Vol. %) Conduit | Gas Composition (Vol. %) Pipes 62A & 62B | Gas Flow Rate liters/min. Conduit 17 | Gas Flow Rate liters/min. Pipes 62A & 62B | C-Gas Conc. in Growth Zone | Film Color | Film Thickness in Angstroms | SPV Diffusion Lengths No C-Gas Fed to Growth Zone | SPV Diffusion Lengths C-gas Fed to Growth Zone | Solar Cell Efficiency |
|---|---|---|---|---|---|---|---|---|---|---|
| 1 | A[e] | A | 10–20 | 2.0 | 20 ppm | no film | no film | 15–35 μm | — | 8–10%[b] |
| 2 | A | No flow | 1.0 | 0.0 | 500 ppm | dull | 200–500 | 50 μm | — | 11.5%[c] |
| 3 | A | 1% $CO_2$ in A | 3.0–4.0 | 0.2–0.5 | 600–1200 ppm[a] | dull | 200–500 | — | 45 μm | 12.5%[c] |
| 4 | A | 800–6000 ppm CO in A | 5.0 | 4.0 | 50–1000 ppm[a] | dull | 200–500 | — | 40 μm | —[d] |
| 5 | A | 800–6000 ppm $CH_4$ in A | 5.0 | 4.0 | 50–1000 ppm[a] | dull | 200–500 | — | 47 μm | —[d] |

[a] Estimated values of concentration
[b] This range of values represents the previous averages of efficiencies accumulated during a large number of experiments carried out under the standard operation mode of gas flows described in the text
[c] This value represents the best achieved within the range of given conditions
[d] The present solar cell fabrication process precludes use of this material for effective solar cell fabrication
[e] A = Argon It is clear from Table I that the SPV results of Cases Nos. 2–5 are significantly better than the results of Case No. 1 and the best solar cells came from Cases Nos. 2 and 3.

Changes may be made in the invention so that it may be practiced otherwise than as specifically shown and described herein. Thus, for example, another gas or a mixture of gases, e.g., helium, may be used in place of argon. Also, the carbon-containing gas may be or include a species other than one of those described above, e.g., ethane, propane, butane, ethylene, propylene, butylene, and homologs and analogs thereof, e.g., ethylene oxide, and the like. While it is preferred that the carbon-containing gas be CO, $CO_2$ or a relatively low molecular weight hydrocarbon, or an oxygen-containing homolog or analog of such hydrocarbon, it is appreciated that the carbon-containing gas may comprise some other species, e.g., dimethylethane or methyl benzene. The important thing is that the carbon-containing gas (a) provide CO or be conducive to forming or promoting the formation of CO in the growth zone by reaction with oxygen or any oxygen-containing gases such as $CO_2$ or $H_2O$ that may be present in the growth zone, (b) not introduce any other impurities, and (c) not prevent suitable growth conditions from being established and maintained.

well as a carbon-containing gas is introduced to the furnace, is the same as the concentration specified hereinabove in the case where the carbon-containing gas is supplied without a separate stream of oxygen gas.

Obviously, the carbon-containing gas could be introduced with the gas in conduit 17. Also the process is capable of being practiced in installations which do not include a cartridge. Thus, for example, the inert gas/carbon-containing gas mixture, with or without oxygen gas, may be introduced in an EFG or Ciszek setup as jet streams using pipes located in the growth zone similar to the cooling gas pipes disclosed in U.S. Pat. Nos. 3,124,489 and 3,265,469, and the furnace could be arranged differently, e.g., like the one shown in U.S. Pat. Nos. 3,591,348 and 3,291,571.

It is to be appreciated also that the invention is not limited to the production of ribbons. Instead it is applicable to growth of silicon bodies having circular, polygonal, arcuate or other cross-sectional shapes. The invention also is applicable to other P-type silicon, N-type silicon and also undoped silicon.

Still other modifications and advantages will be obvious to persons skilled in the art.

As used herein in connection with carbon-containing gases, the term "trace amount" is intended to denote an amount less than about 25 ppm having no discernable effect on crystal growth. As to other gases present in the inert gas as impurities, a trace amount, means up to about 25 ppm for oxygen and water and up to about 5 ppm for other gaseous impurities.

Also as used herein the term "shaping member" is intended to mean a capillary die or a projection as used in the Ciszek method.

What is claimed is:

1. In a method of growing a crystallized body of silicon from a silicon melt where a stationary graphite shaping member is used in the growth zone and the liquid/solid growth interface is characterized by a meniscus between the shaping member and the growing body, the improvement comprising continuously enveloping the growth zone with a moving mixture of an inert gas and a carbon-containing gas, said carbon-containing gas constituting a relatively small proportion of said mixture so as to beneficially affect the electronic quality of the grown silicon body.

2. A method according to claim 1 wherein said carbon-containing gas is carbon monoxide, carbon dioxide or a mixture thereof.

3. Method according to claim 1 wherein said carbon-containing gas comprises CO.

4. Method according to claim 1 wherein said carbon-containing gas comprises $CO_2$.

5. Method according to claim 2 wherein said mixture of said inert gas and said carbon-containing gas contains between about 25 and 5000 ppm of said carbon-containing gas.

6. A method according to claim 1, wherein said inert gas is argon or helium.

7. A method according to claim 1 wherein said inert gas and carbon-containing gas are introduced to said growth zone so as to maintain a concentration of said carbon-containing gas in the atmosphere surrounding said growth zone of between about 25 and about 5000 ppm.

8. Method according to claim 1 wherein said shaping member is a capillary die.

9. Method according to claim 8 wherein said shaping member is located in a graphite crucible.

10. Method according to claim 1 further including the step of introducing oxygen gas to the growth zone.

11. Method according to claim 10 wherein the carbon-containing gas is CO or $CO_2$ or a mixture thereof.

12. Method according to claim 2 wherein said shaping member is disposed in a graphite crucible and said shaping member is heated by graphite heaters.

13. A method according to claim 2 wherein said growth zone is a furnace and said mixture of an inert gas and said carbon-containing gas is circulated through said furnace via said growth zone.

14. A method according to claim 1 wherein said shaping member is disposed in a furnace and a gas comprising at least one member of the class consisting of carbon and oxygen is introduced to said furnace via at least one passageway terminating close to said growing body.

15. A method according to claim 2 wherein said passageway is located above said shaping member.

16. A method according to claim 1 wherein said silicon body is in the shape of a flat ribbon and a carbon and oxygen-containing gas is introduced to said growth zone via at least two orifices terminating close to the upper end of said shaping member on opposite sides of said ribbon.

17. A method according to claim 13 wherein a gaseous stream comprising argon or helium is introduced to said furnace via an inlet located below said growth zone, and a mixture of argon or helium and a gas from the class consisting of CO and $CO_2$ is introduced directly to said growth zone via one or more passageways terminating close to said growth zone.

18. A method according to claim 2 wherein said crystallized body is grown above said graphite shaping member and said at least one passageway is located above but close to said graphite shaping member.

19. A method according to claim 8 wherein said inert gas is helium or argon.

20. A method according to claim 1 wherein said carbon-containing gas comprises at least one member of the group consisting of carbon monoxide and carbon dioxide and the concentration of said carbon-containing gas in the growth zone is maintained at a level which will promote the formation of a film comprising $SiO_x$ on the crystallized body, where X has a value of between 1 and 2.

21. A method according to claim 20 wherein said film has a thickness of between about 200 and 600 angstroms.

22. A method according to claim 2 wherein said growth zone includes said menisucs and at least some of said carbon-containing gas is delivered to said growth zone by passageways terminating close to said meniscus.

23. In a method of growing a crystallized ribbon of silicon where a stationary graphite capillary die is used to supply liquid silicon to the growth zone and the liquid/solid growth interface is characterized by a meniscus between the capillary die and the growing ribbon, the improvement comprising establishing and maintaining in the growth zone about the liquid/solid growth interface a gaseous environment consisting of argon or helium and a gaseous compound of carbon and oxygen, with the concentration of said gaseous compound being between about 25 and about 500 ppm so as to beneficially affect the electronic quality of the grown ribbon.

24. A method according to claim 2 wherein at least some of said mixture of an inert gas and a carbon-containing gas is introduced to said growth zone via at least one passageway terminating close to said interface.

* * * * *

UNITED STATES PATENT AND TRADEMARK OFFICE
CERTIFICATE OF CORRECTION

PATENT NO. : 4415401
DATED : November 15, 1983
INVENTOR(S) : Fritz Wald et al

It is certified that error appears in the above-identified patent and that said Letters Patent is hereby corrected as shown below:

Claim 15, column 16, line 3, "2" should be -- 24 --.

Claim 18, column 16, line 18, "2" should be -- 14 --.

Signed and Sealed this

Thirty-first Day of January 1984

[SEAL]

Attest:

GERALD J. MOSSINGHOFF

Attesting Officer      Commissioner of Patents and Trademarks

UNITED STATES PATENT AND TRADEMARK OFFICE
CERTIFICATE OF CORRECTION

PATENT NO. : 4415401

DATED : November 15, 1983

INVENTOR(S) : Fritz Wald et al

It is certified that error appears in the above-identified patent and that said Letters Patent is hereby corrected as shown below:

Claim 23, column 16, line 49, change "500" to -- 5000 --.

Signed and Sealed this

Eleventh Day of July, 1989

Attest:

DONALD J. QUIGG

*Attesting Officer*

*Commissioner of Patents and Trademarks*